United States Patent
Imam et al.

[11] Patent Number: 5,900,764
[45] Date of Patent: May 4, 1999

[54] EFFICIENT VCCP SUPPLY WITH REGULATION FOR VOLTAGE CONTROL

[75] Inventors: Mohamed A. Imam, Boise; Patrick J. Mullarkey, Meridian, both of Id.

[73] Assignee: Micron Technology, Inc., Boise, Id.

[21] Appl. No.: 08/858,647

[22] Filed: May 19, 1997

Related U.S. Application Data

[63] Continuation of application No. 08/355,750, Dec. 14, 1994, Pat. No. 5,721,506.

[51] Int. Cl.$^6$ ....................................................... G06G 7/64
[52] U.S. Cl. ............................ 327/343; 363/21; 365/226; 327/538
[58] Field of Search .............................. 327/11, 125, 128, 327/304, 343, 494, 538, 531, 532, 533, 84, 86, 92, 103, 104, 423, 428, 443, 330, 582; 363/15, 20, 21, 95, 97; 336/200; 365/226

[56] References Cited

U.S. PATENT DOCUMENTS

| | | | |
|---|---|---|---|
| 3,609,446 | 9/1971 | Hursh | 315/31 |
| 3,851,239 | 11/1974 | Suzuki | 321/11 |
| 3,934,158 | 1/1976 | Shinozaki | 307/239 |
| 3,973,220 | 8/1976 | Fender et al. | 331/109 |
| 4,306,161 | 12/1981 | Sheinberg | 307/255 |
| 5,070,317 | 12/1991 | Bhagat | 336/200 |
| 5,132,891 | 7/1992 | Kobayashi et al. | 363/21 |
| 5,227,659 | 7/1993 | Hubbard | 257/531 |
| 5,327,333 | 7/1994 | Boylan et al. | 363/21 |
| 5,363,289 | 11/1994 | Jacobs | 363/56 |
| 5,391,977 | 2/1995 | Beland | 323/268 |
| 5,621,348 | 4/1997 | Furutani et al. | 327/390 |
| 5,721,506 | 2/1998 | Imam et al. | 327/330 |

*Primary Examiner*—Timothy P. Callahan
*Assistant Examiner*—Jung Ho Kim
*Attorney, Agent, or Firm*—Seed and Berry LLP

[57] ABSTRACT

A highly efficient compact multiple output voltage generation circuit is designed for use in integrated circuit devices such as DRAMs which require multiple internal voltage supplies for optimum performance. An oscillator is connected to a primary coil of a microtransformer. The microtransformer secondary coil has multiple taps one of which is connected to ground. A second transformer tap is connected to a transformer output node. The oscillating transformer output signal is capacitively coupled to a voltage rectifier. The input to the rectifier is biased to one diode drop below Vcc. The output of the rectifier is an internal supply voltage greater than ground. Another transformer tap is connected to a negative oscillation output node. The negative oscillating signal is rectified to produce a negative internal supply voltage. The voltage generation circuit operates effectively at low Vcc input levels where capacitor based voltage pumps often fail. The circuit is compatible with CMOS manufacturing processes.

4 Claims, 2 Drawing Sheets

5,900,764

EFFICIENT VCCP SUPPLY WITH REGULATION FOR VOLTAGE CONTROL

CROSS-REFERENCE TO RELATED APPLICATION

This application is a continuation of U.S. patent application Ser. No. 08/355,750, filed Dec. 14, 1994 U.S. Pat. No. 5,721,506.

FIELD OF THE INVENTION

The invention relates to very large scale integrated circuits. The invention is particularly applicable to devices such as dynamic random access memories (DRAMs) which require the generation of internal voltage sources for optimum performance.

BACKGROUND OF THE INVENTION

Many integrated circuit devices require internal voltage levels that are not supplied directly from external circuit nodes. State of the art dynamic random access memories (DRAMs) for example are designed with internal voltage pump circuits to generate an elevated supply voltage for use in turning on n-channel memory cell access devices to allow a fill Vcc signal level to pass through the access device into or out of a memory cell. The elevated supply voltage may also be used in output buffer circuits to allow the use of n-channel pull-up devices which provide a CMOS output buffer which is less susceptible to latch-up. The elevated supply voltage is required for controlling the gate node of n-channel transistors in order to prevent a threshold voltage (Vt) drop in logic high signals passed through the transistor.

It is also desirable in DRAM devices to generate a slightly negative internal supply voltage to bias the device substrate below GND potential. The negative supply may also be used to control p-channel transistor gates to allow the p-channel transistors to effectively pass logic low signals.

Typical DRAM devices utilize multiple voltage pump circuits comprising oscillators, coupling capacitors and diodes to generate these internal voltage supplies. Capacitor bootstrap circuits are also commonly used in output buffer circuits to generate above Vcc gate driving voltages for n-channel pull-up transistors. Simple voltage pump circuits are not very efficient. State of the art DRAMs require significant amounts of current to drive large numbers of memory array access devices simultaneously. To meet certain refresh timing requirements, multiple word lines may be driven simultaneously, requiring thousands of access devices to be activated with the elevated supply voltage. Further complicating the elevated voltage generation circuit design is the fact that advanced CMOS processes require internal device circuitry to operate at reduced supply voltages. These low level internal operating voltages have led to requirements for reduced Vcc supply input voltages. Prior art DRAM voltage pump circuits tend to fail at low Vcc levels, or become so inefficient that they are impractical. A need remains for a high efficiency voltage generation circuit which may be fabricated within large scale CMOS integrated circuits that will operate at Vcc levels below three volts, and eventually below one volt Vcc.

SUMMARY OF THE INVENTION

A highly efficient compact multiple output voltage generation circuit is designed for use in integrated circuit devices such as DRAMs which require multiple internal voltage supplies for optimum performance. An oscillator is connected to a primary coil of a microtransformer. The microtransformer secondary coil has multiple taps one of which is connected to GND. Another of the transformer secondary coil taps is connected to a transformer output node. The oscillating signal from the transformer output node is capacitively coupled to a voltage rectifier. The input to the rectifier is biased to one diode drop below Vcc. The output of the rectifier is an internal supply voltage greater than GND. Another transformer secondary tap is connected to a negative oscillation transformer output node. The negative oscillating signal is rectified to produce a negative internal supply voltage.

For a two metal CMOS semiconductor integrated circuit fabrication process, the microtransformer utilizes a tungsten silicide poly layer to form bottom portions of transformer coils. Poly to metal contacts and metal to metal contacts form the sides of the coils, and an aluminum layer (metal2) is used to form the top of each inductor coil. The transformer core is formed with aluminum (metal1). The microtransformer requires no additional processing steps beyond the CMOS process steps required to fabricate other circuitry on the device. Each coil of the transformer will typically have thousands of turns which provides for a wide range of possible transformer ratios.

BRIEF DESCRIPTION OF THE DRAWINGS

The features of the invention as well as objects and advantages will be best understood by reference to the appended claims, detailed description of particular embodiments and accompanying drawings where:

DETAILED DESCRIPTION OF THE PREFERRED EMBODIMENTS

Figure 1:
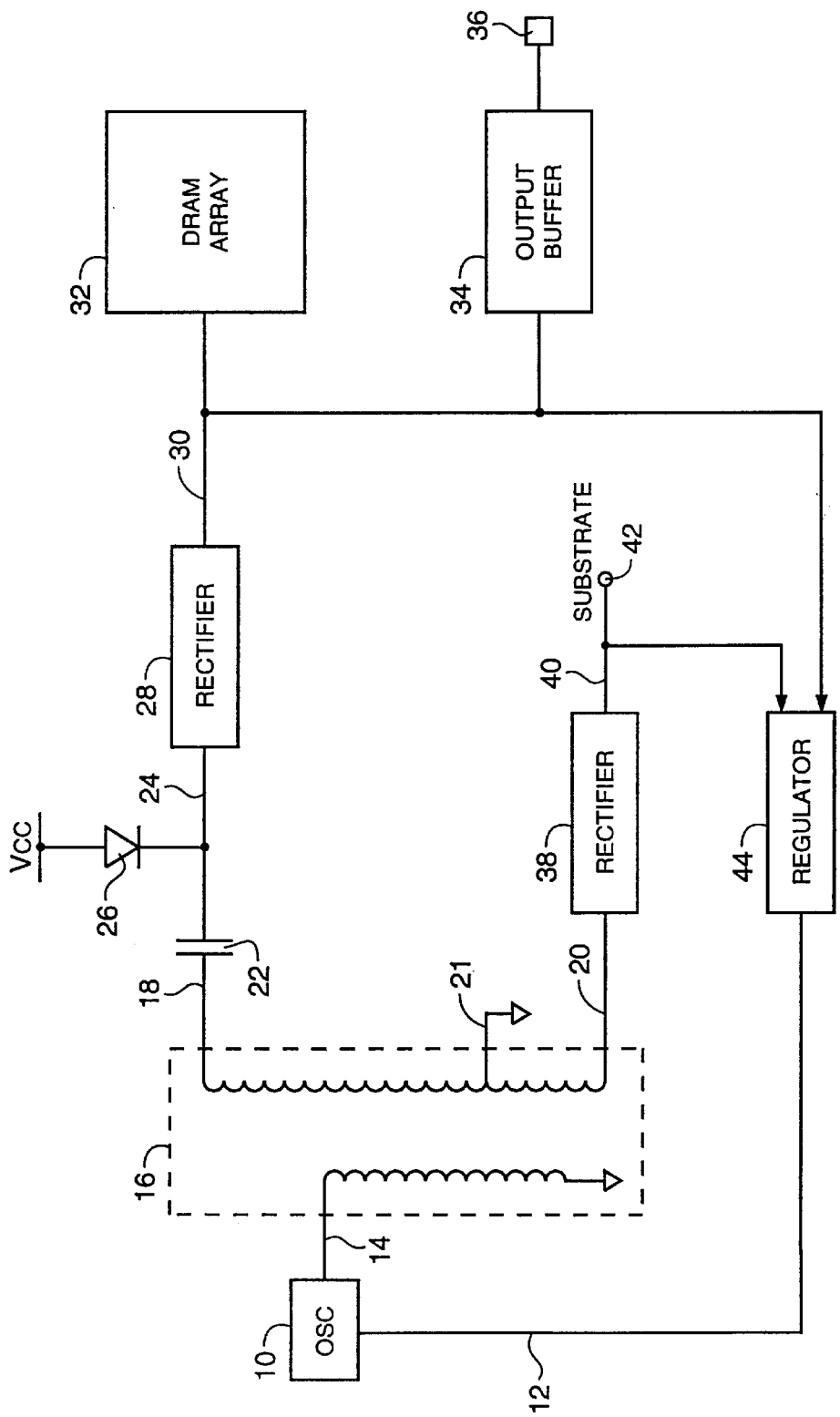
FIG. 1 is a schematic of a voltage generation circuit designed in accordance with the teachings of the present invention.

In FIG. 1, an oscillator 10 when enabled by an active high enable signal at node 12 will produce a periodic signal at node 14. Methods of generating oscillatory signals are well known to those skilled in the art. One method of producing an oscillating signal is to provide a loop of an odd number of inverting logic gates. One of the gates in the loop receives the enable signal in addition to the oscillation signal. For devices with external oscillator connections such as synchronous dynamic random access memory (SDRAM) devices, the circuit 10 may simply be a clock buffer which buffers and gates the SDRAM clock signal. The oscillation node 14 is connected to the primary coil of transformer 16. The secondary coil of the transformer has three signal nodes. Elevated signal node 18 provides a stepped up version of the oscillation signal on node 14. Signal node 20 provides a negative version of the oscillation signal on node 14. An intermediate signal node 21 of the secondary coil is tied to ground. If the active high enable signal at node 12 is low, no oscillations will be produced at nodes 14, 18 or 20. The elevated signal node 18 is connected to AC coupling capacitor 22. Signal node 24 is DC biased to one diode drop below Vcc by diode 26. Signal node 24 is connected to voltage rectifier 28. Voltage rectifiers are well known and may be designed by one who is skilled in the art. A simple voltage rectifier may consist of a single diode. In a DRAM, the output of the rectifier will typically be highly capacitively loaded. For other applications it may be desirable to place a capacitor to ground at the output of the rectifier to filter out any ripple voltage that may be present. When the oscillator is enabled, an elevated voltage will be generated at node 30. This elevated voltage is connected to memory cell access devices within the DRAM array 32 and to output buffer circuit 34. The output buffer is tied to an output pad 36. The negative oscillator signal at node 20 is connected to voltage rectifier 38 and may also be filtered with a capacitor though in this case the output signal line is routed throughout the semiconductor chip and is sufficiently capacitive. The negative potential output signal line 40 is tied to the device substrate 42 throughout the chip. Both the elevated voltage signal line 30 and the negative supply signal line 40 are connected to voltage regulator 44. The regulator monitors the two generated voltage levels and produces the oscillator enable signal on signal node 12 whenever the elevated voltage drops too low, or whenever the stepped down voltage is too high. When the generated voltages reach extreme levels, the oscillating signal is prevented from reaching the transformer by disabling the oscillator. In some designs it may be desirable to allow the oscillator to continue to run. In this case the oscillator enable signal may simply be used to control a gate which controls whether or not the oscillating signal reaches the transformer. In some designs it may only be necessary to monitor one of the generated voltages rather than both. Voltage regulators are also well known to those skilled in the art and a detailed description of a complex regulator will not be provided here. A simple voltage regulator may consist essentially of a string of diodes with a buffer input node tied to one of the diode to diode interconnections. The buffer output node is then connected to the enable signal node 12 which is the regulator output node.

Figure 2:
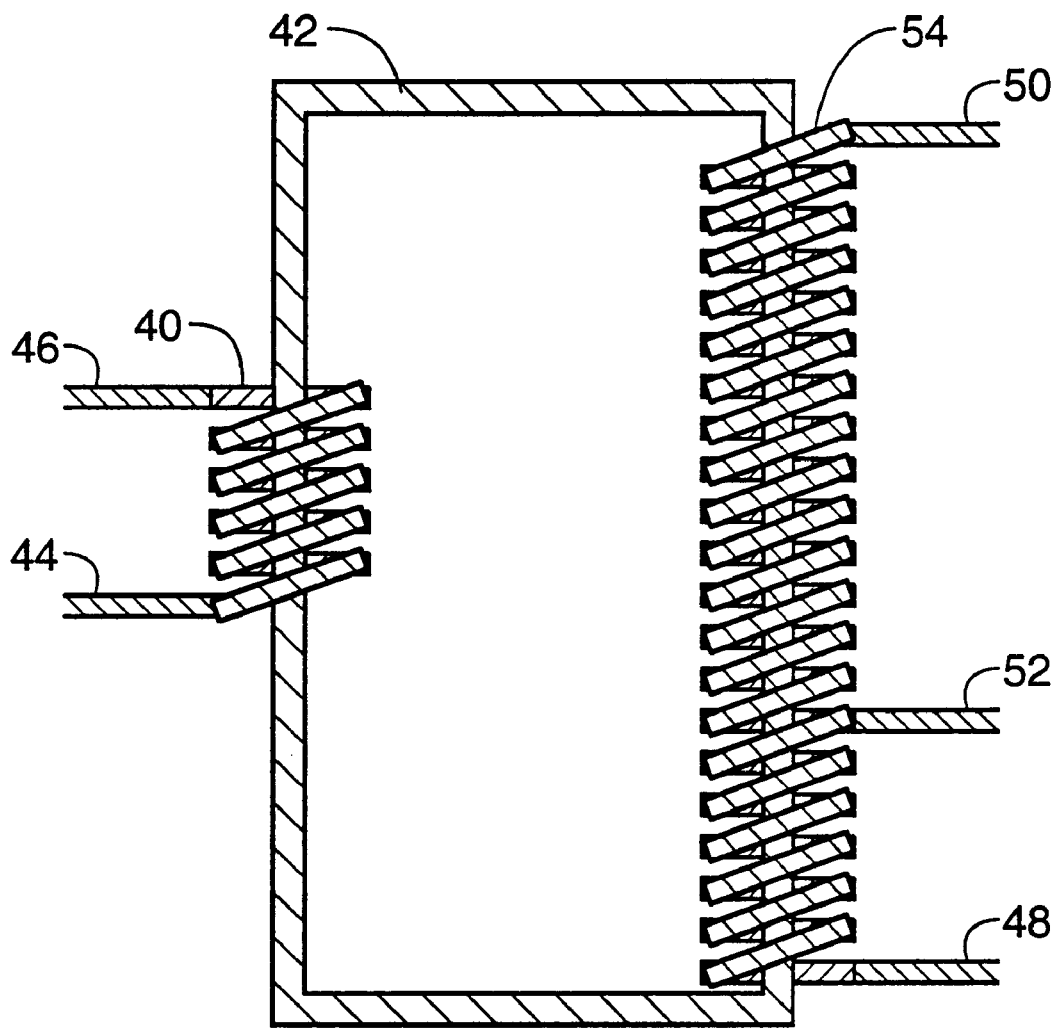
FIG. 2 is a top view of a portion of a layout for the circuit of FIG. 1.

The transformer in the circuit of FIG. 1 may be fabricated using standard CMOS processes. No additional process steps need be performed, and no additional types of materials are required. FIG. 2 is a top view of a layout of the transformer of FIG. 1 with a dramatically reduced number of turns. The primary and secondary coils of the transformer will typically have thousands of turns.

Referring now to FIG. 2, a polysilicon (poly) layer 40 with a tungsten silicide outer layer forms the bottom of both the primary and secondary coils. A first metal layer 42 is isolated from the poly layer by an insulating layer. The first metal layer is used to form the transformer core, primary input nodes 44 and 46, and secondary output nodes 48, 50 and 52. The primary input node 46 is connected to the output of the ring oscillator of FIG. 1, nodes 44 and 52 are connected to ground, node 50 is the elevated signal node of FIG. 1, and node 48 is the stepped down signal node of the transformer of FIG. 1. A second metal layer 54 forms the top of the primary and secondary coils. Contacts from the poly layer to the first metal layer, and vias from the first metal layer to the second metal layer form the sides of the coils. The poly layer is also used to form transistor gates for other circuits on the device. The first and second metal layers are used as interconnection layers for other circuitry on the device. No additional process steps are required beyond those required to form the other circuitry on the device. The poly which forms a portion of the transformer coil may also be used to form capacitors, diodes, transistors or resistors. The two metal layers described along with the contacts and vias are used for circuitry interconnections throughout the device.

Other combinations of materials may be utilized as required by alternate semiconductor device process flows, but no additional process steps or materials are required to form the transformer. A three metal CMOS process for example may use first and third metal layers to form top and bottom portions of the coils with a core formed from the second metal layer. The voltage generating circuit of the present invention is efficient, and will operate at very low levels of Vcc without a significant decrease in efficiency.

What is claimed is:

1. An integrated circuit having a semiconductor substrate and a Vcc supply node, comprising:

an n-channel transistor having a gate, a source, and a drain;

a transformer circuit comprising primary and secondary coils wound about a conductive inner core;

a clock circuit coupled to said transformer primary coil and to the Vcc supply node for providing an oscillating signal to said transformer primary coil;

a voltage rectifier circuit coupled to said transformer secondary coil an output of said voltage rectifier circuit being selectively coupled to the gate of said n-channel transistor so that a voltage greater than Vcc can be applied to the gate to enable Vcc to be coupled from the drain to the source of the n-channel transistor; and a capacitor electrically interposed between said transformer secondary coil and said voltage rectifier for AC coupling said transformer secondary coil to said voltage rectifier to provide an AC coupled input signal thereto.

2. The integrated circuit of claim 1, further comprising a diode coupled to a reference voltage node and to said voltage rectifier for biasing the AC coupled input signal.

3. The integrated circuit of claim 2, wherein the reference voltage node is the Vcc supply node.

4. A dynamic random access memory device having a supply node to receive a supply potential and a plurality of memory cells integrated on a semiconductor substrate, comprising:

a transformer primary coil wound about a conductive inner core;

a transformer secondary coil comprising first, second and third terminals, said secondary coil wound about the conductive inner core and inductively coupled to said transformer primary coil, said third terminal coupled to a ground node;

an oscillator circuit coupled to said transformer primary coil for providing an oscillating signal to said transformer primary coil;

a first voltage rectifier circuit coupled to said first terminal, said first voltage rectifier circuit being operable to provide a boosted potential on an output of said first voltage rectifier is greater than the supply potential;

a second voltage rectifier circuit coupled to said second terminal and to the semiconductor substrate, said second voltage rectifier circuit being operable to bias the substrate below ground potential; and an n-channel memory cell access device selectively coupled to said first voltage rectifier circuit;

a capacitor electrically coupled in series between said transformer secondary coil and said first voltage rectifier circuit; and a diode electrically coupled between the supply node and said first voltage rectifier circuit.

\* \* \* \* \*